(12) United States Patent
Lin et al.

(10) Patent No.: US 10,424,659 B1
(45) Date of Patent: Sep. 24, 2019

(54) HIGH ELECTRON MOBILITY TRANSISTOR

(71) Applicant: Vanguard International Semiconductor Corporation, Hsinchu (TW)

(72) Inventors: Shin-Cheng Lin, Tainan (TW); Hsin-Chih Lin, Hsinchu (TW); Yung-Hao Lin, Jhunan Township (TW); Chia-Ching Huang, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/973,888

(22) Filed: May 8, 2018

(51) Int. Cl.
*H01L 29/778* (2006.01)
*H01L 29/06* (2006.01)
*H01L 29/10* (2006.01)

(52) U.S. Cl.
CPC ...... *H01L 29/7783* (2013.01); *H01L 29/0611* (2013.01); *H01L 29/1054* (2013.01)

(58) Field of Classification Search
CPC ............. H01L 29/7783; H01L 29/1054; H01L 29/0611
See application file for complete search history.

(56) References Cited

U.S. PATENT DOCUMENTS

| | | | | |
|---|---|---|---|---|
| 6,166,404 A * | 12/2000 | Imoto | ................. | H01L 21/8234 257/192 |
| 10,002,956 B1 * | 6/2018 | Lin | .................... | H01L 29/7786 |
| 2008/0296618 A1 | 12/2008 | Suh et al. | | |
| 2009/0146185 A1 | 6/2009 | Suh et al. | | |
| 2010/0276732 A1 | 11/2010 | Ando et al. | | |
| 2011/0210377 A1 * | 9/2011 | Haeberlen | ........... | H01L 29/2003 257/194 |
| 2013/0077352 A1 | 3/2013 | Shimizu et al. | | |
| 2013/0320349 A1 * | 12/2013 | Saunier | ............ | H01L 29/66462 257/76 |

(Continued)

OTHER PUBLICATIONS

Taiwanese Office Action and Search Report, dated Jun. 12, 2018, for Taiwanese Application No. 107100044.

*Primary Examiner* — Mamadou L Diallo
(74) *Attorney, Agent, or Firm* — Birch, Stewart, Kolasch & Birch, LLP

(57) ABSTRACT

A high electron mobility transistor includes a buffer layer, a threshold voltage adjustment layer, a band adjustment layer, a first enhancement layer, a gate electrode, and source/drain electrodes. The threshold voltage adjustment layer is disposed on the buffer layer. A channel region is disposed in the buffer layer adjacent to an interface between the buffer layer and the threshold voltage adjustment layer. The band adjustment layer is disposed on the threshold voltage adjustment layer. The first enhancement layer is conformally covering the threshold voltage adjustment layer and the band adjustment layer. The gate electrode is disposed on the first enhancement layer. The source/drain electrodes are disposed on the buffer layer through the threshold voltage adjustment layer and the first enhancement layer on opposite sides of the gate electrode respectively. The threshold voltage adjustment layer and the first enhancement layer are III-V semiconductors.

17 Claims, 3 Drawing Sheets

(56) References Cited

U.S. PATENT DOCUMENTS

| | | | | |
|---|---|---|---|---|
| 2014/0319532 A1* | 10/2014 | Werner | ............... | H01L 29/2003 257/76 |
| 2015/0104911 A1* | 4/2015 | Prechtl | .............. | H01L 29/66462 438/172 |
| 2017/0117401 A1* | 4/2017 | Shi | ....................... | H01L 29/2003 |
| 2017/0170284 A1* | 6/2017 | Li | ......................... | H01L 29/401 |
| 2017/0207300 A1* | 7/2017 | Pei | ....................... | H01L 21/3065 |

* cited by examiner

HIGH ELECTRON MOBILITY TRANSISTOR

BACKGROUND

Technical Field

The disclosure relates to a semiconductor technology, and more particularly to a high electron mobility transistor (HEMT).

Description of the Related Art

High electron mobility transistors (HEMT) are widely applied in high-power semiconductor devices due to their many advantages, which include high breakdown voltage and high output voltage.

Due to the Miller Effect, a surge caused by the parasitic capacitance and the parasitic inductance increases the gate voltage. The device may burn out if the device is not turned on normally. Therefore, the threshold voltage of the high electron mobility transistors needs to be raised to reduce circuit damage.

Enhancement mode (E-mode) high electron mobility transistors may be formed by gate recessing. However, since it is not easy to control process uniformity during gate recessing, the uniformity of the electrical parameters may be impacted.

Although existing high electron mobility transistors have generally been adequate for their intended purposes, they have not been entirely satisfactory in all respects and need to be improved. Their threshold voltage in particular needs to be increased, and their on-resistance needs to be decreased.

BRIEF SUMMARY

The present disclosure provides a high electron mobility transistor (HEMT). The high electron mobility transistor includes a buffer layer disposed on a substrate. The high electron mobility transistor further includes a threshold voltage adjustment layer disposed on the buffer layer. The high electron mobility transistor further includes a channel region disposed in the buffer layer adjacent to the interface between the buffer layer and the threshold voltage adjustment layer. The high electron mobility transistor further includes a band adjustment layer disposed on the threshold voltage adjustment layer. The high electron mobility transistor further includes a first enhancement layer conformally covering the threshold voltage adjustment layer and the band adjustment layer. The high electron mobility transistor further includes a gate electrode disposed on the first enhancement layer. The high electron mobility transistor further includes source/drain electrodes disposed on the buffer layer through the threshold voltage adjustment layer and the first enhancement layer on opposite sides of the gate electrode respectively. The threshold voltage adjustment layer and the first enhancement layer are III-V semiconductors.

The present disclosure also provides a high electron mobility transistor (HEMT). The high electron mobility transistor includes a buffer layer disposed on a substrate. The high electron mobility transistor further includes a threshold voltage adjustment layer disposed on the buffer layer. The high electron mobility transistor further includes a channel region disposed in the buffer layer adjacent to the interface between the buffer layer and the threshold voltage adjustment layer. The high electron mobility transistor further includes a first enhancement layer disposed on the threshold voltage adjustment layer. The high electron mobility transistor further includes a gate electrode disposed on the first enhancement layer. The high electron mobility transistor further includes source/drain electrodes disposed on the buffer layer through the threshold voltage adjustment layer and the first enhancement layer on opposite sides of the gate electrode respectively. The high electron mobility transistor further includes a doping region disposed in the threshold voltage adjustment layer and the first enhancement layer beneath the gate electrode. The doping region comprises fluorine (F), and the threshold voltage adjustment layer and the first enhancement layer are III-V semiconductors.

A detailed description is given in the following embodiments with reference to the accompanying drawings.

BRIEF DESCRIPTION OF DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
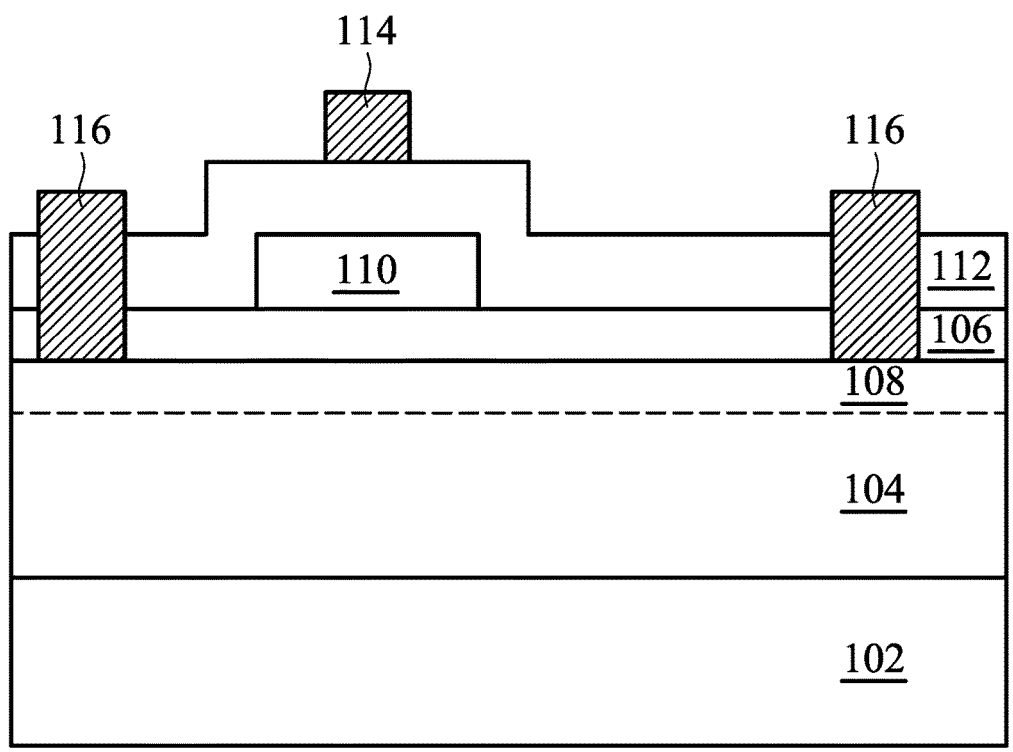
FIG. 1 is a cross-sectional representation of a high electron mobility transistor in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Herein, the terms "around," "about," "substantial" usually mean within 20% of a given value or range, preferably within 10%, and better within 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

The embodiments of the present disclosure provide a high electron mobility transistor (HEMT). By fine-tuning the thickness and the molar concentration of more than two layers of III-V semiconductors, the piezoelectricity can be modified and the threshold voltage can effectively be controlled and increased while maintaining good uniformity. The two-dimensional electron gas (2DEG) concentration in the channel region has increased, and the on-resistance has decreased.

FIG. 1 is a cross-sectional representation of a high electron mobility transistor 100 in accordance with some embodiments of the present disclosure. As shown in FIG. 1, a substrate 102 is provided. The substrate 102 may include Si, SiC, or $Al_2O_3$ (sapphire). The substrate 102 may be a single-layer substrate, a multi-layer substrate, a gradient substrate, another suitable substrate, or a combination thereof. In some embodiments, the substrate 102 may also include a semiconductor on insulator (SOI) substrate. The above SOI substrate may include a base plate, a buried oxide (BOX) layer disposed on the base plate, and a semiconductor layer disposed on the buried oxide (BOX) layer.

Next, a buffer layer 104 is formed on the substrate 102. In some embodiments, the buffer layer 104 includes a III-V semiconductor such as GaN. The buffer layer 104 may have a thickness of between 0.5 µm and 10 µm and formed on the substrate 102 by any suitable process such as molecular-beam epitaxy (MBE), metalorganic chemical vapor deposition (MOCVD), chemical vapor deposition (CVD), hydride vapor phase epitaxy (HVPE), or a combination thereof.

Next, a threshold voltage adjustment layer 106 is formed on the buffer layer 104. In some embodiments, the threshold voltage adjustment layer 106 includes III-V semiconductors such as $Al_xGa_{1-x}N$, where 0<x<1. In some embodiments, the threshold voltage adjustment layer 106 has a thickness of between 1 nm and 5 nm and an Al molar concentration of between 0.05 M and 0.4 M. In some embodiments, the threshold voltage adjustment layer 106 is formed on the buffer layer 104 by molecular-beam epitaxy (MBE), metalorganic chemical vapor deposition (MOCVD), chemical vapor deposition (CVD), hydride vapor phase epitaxy (HVPE), other suitable methods, or a combination thereof.

The buffer layer 104 and the threshold voltage adjustment layer 106 are formed of materials of different band gap and therefore a heterojunction is formed at the interface between the buffer layer 104 and the threshold voltage adjustment layer 106. Due to band bending at the heterojunction, a quantum well is formed at the deep bend of the conduction band. The electrons produced by piezoelectricity are confined in the quantum well. Therefore, a two-dimensional electron gas (2DEG) is formed at the interface between the buffer layer 104 and the threshold voltage adjustment layer 106, and a conducting current is formed. As shown in FIG. 1, a channel region 108 is formed at the interface between the buffer layer 104 and the threshold voltage adjustment layer 106. The channel region 108 is where the conducting current is formed by the two-dimensional electron gas (2DEG). In some embodiments, the channel region 108 has a thickness of between 0.1 µm and 5 µm.

The piezoelectricity may be modified by fine-tuning the thickness and the III-V elements molar concentration of the threshold voltage adjustment layer 106. Using AlGaN as an example, when the thickness of the threshold voltage adjustment layer 106 is thinner and the Al molar concentration of the threshold voltage adjustment layer 106 is lower, the piezoelectricity is weaker, and there are less two-dimensional electron gas produced in the channel region 108.

To avoid devices burning out due to the circuit surge caused by Miller effect, the threshold voltage of the high electron mobility transistor needs to be raised. Using AlGaN as an example, the conducting current may be lower and the threshold voltage may be higher by decreasing the thickness and the Al molar concentration of the threshold voltage adjustment layer 106.

Next, a band adjustment layer 110 is formed on the threshold voltage adjustment layer 106. The band adjustment layer 110 is a P-type doped III-V semiconductor, including P-type doped GaN, AlGaN, AN, GaAs, AlGaAs, InP, InAlAs, or InGaAs. The P-type doping concentration is between about $1e17/cm^3$ and $1e20/cm^3$. The thickness of the band adjustment layer 110 is between about 50 nm and 200 nm. The P-type doped III-V semiconductor may be deposited by molecular-beam epitaxy (MBE), metalorganic chemical vapor deposition (MOCVD), chemical vapor deposition (CVD), or hydride vapor phase epitaxy (HVPE). The P-type doped III-V semiconductor is then patterned to form the band adjustment layer 110. In some embodiments, the band adjustment layer 110 is disposed beneath the gate electrode which will be formed later.

Since the band adjustment layer 110 is a P-type doped III-V semiconductor, the P-type doping raises the energy bands. Therefore, the energy of the conduction band at the interface between the buffer layer 104 and the threshold voltage adjustment layer 106 is higher than the Fermi level, which results in no two-dimensional electron gas (2DEG) is produced in the channel region 108 and therefore no conducting current is produced.

Since the band adjustment layer 110 raises the energy band, the high electron mobility transistor 100 is cut off when no gate voltage is applied. Therefore, the high electron mobility transistor 100 is an enhancement mode (E-mode) high electron mobility transistor.

Compared to D-mode high electron mobility transistors, E-mode high electron mobility transistors are safer, and the standby power dissipation is lower. Since there is no need to apply a negative bias voltage, the circuit complexity and the production cost may also be reduced. In this embodiment, since there is no need to recess the gate to form E-mode high electron mobility transistors, the issue of worse uniformity caused by gate recessing may be prevented. With the threshold voltage adjustment layer 106, the threshold voltage of the E-mode high electron mobility transistors may be raised while maintaining good uniformity. In some embodiments, the threshold voltage of the E-mode high electron mobility transistors may be greater than 2 V.

Next, a first enhancement layer 112 is formed. In some embodiments, the first enhancement layer 112 may include III-V semiconductors such as $Al_xGa_{1-x}N$, where 0<x<1. In some embodiments, the first enhancement layer 112 has a thickness of between 15 nm and 25 nm and an Al molar concentration of between 0.05 M and 0.4 M. In some embodiments, the first enhancement layer 112 may conformally cover the threshold voltage adjustment layer 106 and the band adjustment layer 110 by molecular-beam epitaxy (MBE), metalorganic chemical vapor deposition (MOCVD), chemical vapor deposition (CVD), hydride vapor phase epitaxy (HVPE), other suitable methods, or a combination thereof.

The piezoelectricity may be modified by fine-tuning the thickness and the III-V elements molar concentration of the first enhancement layer 112. Using AlGaN as an example, when the thickness of the first enhancement layer 112 is thicker and the Al molar concentration is greater, the piezoelectricity is more significant, and there is more two-dimensional electron gas produced in the channel region 108. The on-resistance may be decreased by increasing the thickness and the Al molar concentration of the first enhancement layer 112.

In the embodiment as shown in FIG. 1, the threshold voltage adjustment layer 106 is mainly for increasing the threshold voltage, and the first enhancement layer 112 is mainly for reducing the on-resistance. Therefore, taking AlGaN as an example, the Al molar concentration of the threshold voltage adjustment layer 106 is less than that of the first enhancement layer 112, and the thickness of the threshold voltage adjustment layer 106 is less than that of the first enhancement layer 112.

Next, a gate electrode 114 is formed on the first enhancement layer 112. In some embodiments, the gate electrode 114 may include metal, polysilicon, metal silicide, another suitable conductive material, or a combination thereof. In some embodiments, the electrode material is formed on the first enhancement layer 112 by electroplating, sputtering, resistive heating evaporation, e-beam evaporation, physical vapor deposition (PVD), chemical vapor deposition (CVD), atomic layer deposition (ALD), other suitable methods, or a combination thereof. The electrode material is then patterned by a photolithography and an etching process, and the gate electrode 114 is formed.

Next, source/drain electrodes 116 are formed on the opposite sides of the gate electrode 114. The source/drain electrodes 116 are disposed on the buffer layer 108 through the threshold voltage adjustment layer 106 and the first enhancement layer 112. In this way, the ohmic contact resistance of the source/drain electrodes 116 is reduced. In some embodiments, the source/drain electrodes 116 may respectively include Ti, Al, W, Au, Pd, another suitable metal, their alloy, or a combination thereof. In some embodiments, holes for the source/drain electrodes 116 are etched through the threshold voltage adjustment layer 106 and the first enhancement layer 112 by an etching process, and the electrode material are deposited in the holes by electroplating, sputtering, resistive heating evaporation, e-beam evaporation, physical vapor deposition (PVD), chemical vapor deposition (CVD), atomic layer deposition (ALD), other suitable methods, or a combination thereof. The electrode material is then patterned by a photolithography and an etching process, and the source/drain electrodes 116 are formed.

It should be noted that, in the description above, the gate electrode 114 is formed first and the source/drain electrodes 116 are formed later. However, the forming sequence is not so limited. The source/drain electrodes 116 may be formed first and the gate electrode 114 is formed later.

In the embodiment as shown in FIG. 1, as well as the threshold voltage adjustment layer 106 and the first enhancement layer 112, the band adjustment layer 110 is disposed beneath the gate electrode 114 to make the high electron mobility transistor 100 be an enhancement mode (E-mode) high electron mobility transistor. The overall piezoelectricity is modulated by the threshold voltage adjustment layer 106 and the first enhancement layer 112 to accurately control and increase the threshold voltage while maintaining good uniformity. When the enhancement mode (E-mode) high electron mobility transistor 100 is turned on, the two-dimensional electron gas (2DEG) is enhanced and the on-resistance is reduced.

In some embodiments as shown in FIG. 1, taking AlGaN as an example, the respective thickness and the Al molar concentration of the threshold voltage adjustment layer 106 and the first enhancement layer 112 may be fine-tuned to make the high electron mobility transistor 100 be a depletion mode (D-mode) high electron mobility transistor without forming the band adjustment layer 110, and be an enhancement mode (E-mode) high electron mobility transistor with the band adjustment layer 110. In some embodiments, taking AlGaN as an example, the threshold voltage adjustment layer 106 has a thickness of between 1 nm and 5 nm and an Al molar concentration of between 0.05 M and 0.4M. The first enhancement layer 112 has a thickness of between 15 nm and 25 nm and an Al molar concentration of between 0.05 M and 0.4 M. In this way, a composite high electron mobility transistor with both D-mode and E-mode high electron mobility transistors may be formed by the same threshold voltage adjustment layer 106 and the first enhancement layer 112. The cost and time required for production may be reduced.

Figure 2:
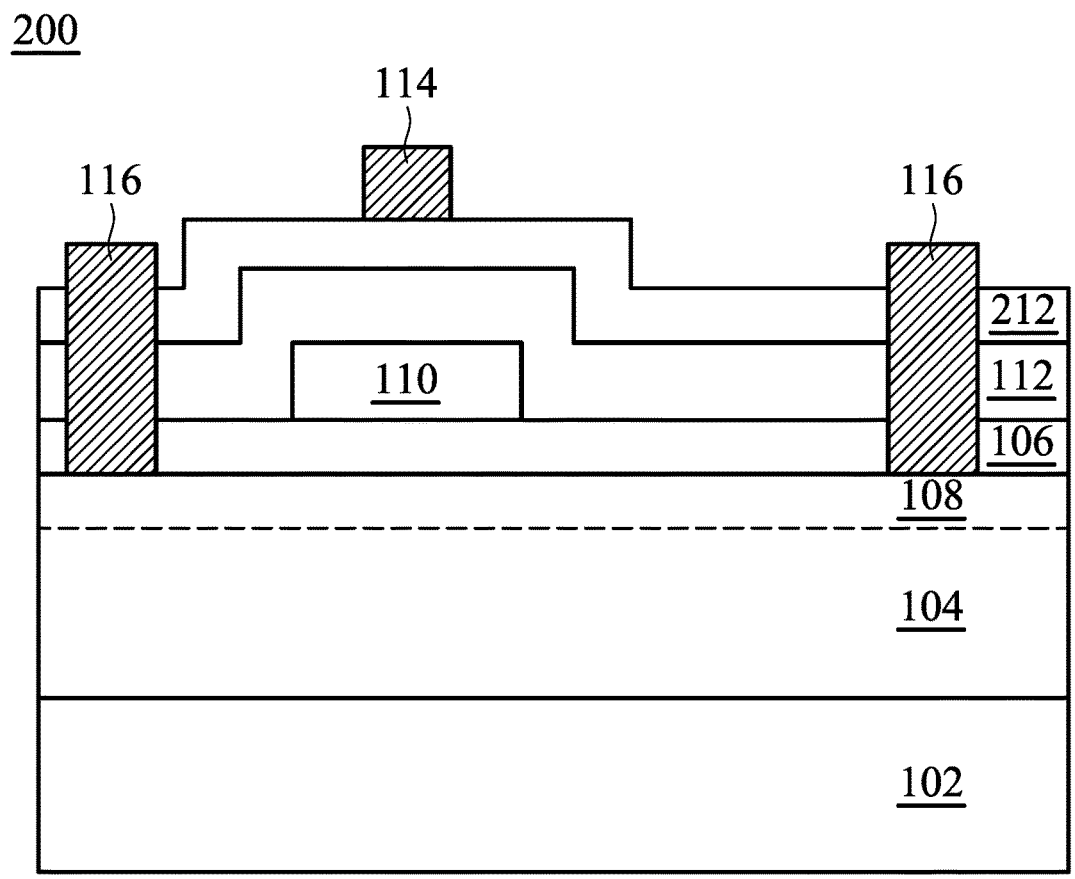
FIG. 2 is a cross-sectional representation of a high electron mobility transistor in accordance with some other embodiments.

FIG. 2 is a cross-sectional representation of a high electron mobility transistor 200 in accordance with another embodiment of the present disclosure. Some processes or devices are the same as, or similar to, those described in the embodiments above, and therefore the reference numerals and/or letters may repeat. For the purpose of brevity, the descriptions of these processes and devices are not repeated herein. The difference from the embodiments described above is that after forming the first enhancement layer 112, a second enhancement layer 212 is formed thereon. In some embodiments, the second enhancement layer 212 may include III-V semiconductors such as $Al_xGa_{1-x}N$, where $0<x<1$. In some embodiments, the second enhancement layer 212 has a thickness of between 1 nm and 10 nm and an Al molar concentration of between 0.05 M and 0.4 M. In some embodiments, the second enhancement layer 212 may conformally cover the first enhancement layer 112 by molecular-beam epitaxy (MBE), metalorganic chemical vapor deposition (MOCVD), chemical vapor deposition (CVD), hydride vapor phase epitaxy (HVPE), other suitable methods, or a combination thereof.

It should be noted that, although only the second enhancement layer 212 is shown in FIG. 2, the present disclosure is not limited thereto. Depending on the product demands, multiple enhancement layers may be formed on the first enhancement layer 112, which respectively include III-V semiconductors such as $Al_xGa_{1-x}N$, where $0<x<1$.

In the embodiment as shown in FIG. 2, taking AlGaN as an example, each enhancement layer of the multiple enhancement layers may have the same or different thickness and Al molar concentration. Therefore, the flexibility in design and manufacture of the device may increase with multiple enhancement layers. The overall piezoelectricity and the band structure can be modified by fine-tuning the thickness and the Al molar concentration of the multiple enhancement layers. The threshold voltage effectively increases and is accurately controlled. When the high electron mobility transistor 200 is turned on, the two-dimensional electron gas (2DEG) is enhanced and the on-resistance is reduced.

Figure 3:
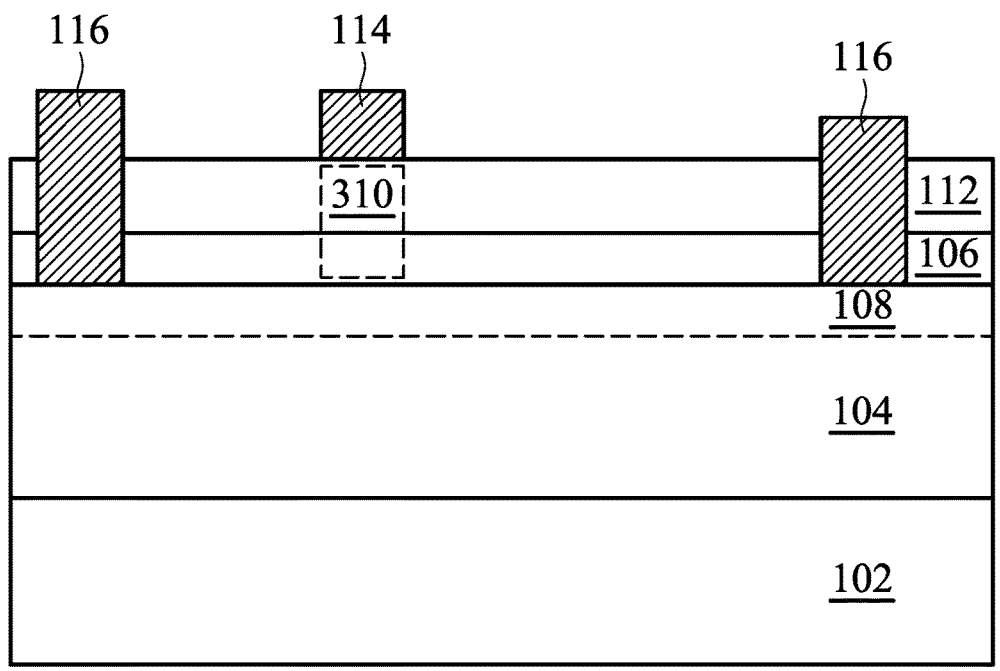
FIG. 3 is a cross-sectional representation of a high electron mobility transistor in accordance with some further embodiments.

FIG. 3 is a cross-sectional representation of a high electron mobility transistor 300 in accordance with some other embodiment of the present disclosure. Some processes or devices are the same as, or similar to, those described in the embodiments above, and therefore the reference numerals and/or letters may repeat. For the purpose of brevity, the descriptions of these processes and devices are not repeated herein. The difference from the embodiments described above is that there is no band adjustment layer 110 disposed beneath the gate electrode 114. Instead, a doping layer 310 is disposed in the threshold voltage adjustment layer 106 and the first enhancement layer 112. In some embodiments, the doping layer 310 may be formed by an ion implantation process. For example, before the gate electrode 114 is formed, $F_2$, $CF_4$, or other fluoride-based ions are implanted in the threshold voltage adjustment layer 106 and the first enhancement layer 112 beneath the gate electrode 114 predetermined region by a patterned mask (not shown) to form the doping layer 310. The dopant concentration of the doping layer 310 is between $1e18/cm^3$ and $1e20/cm^3$.

As shown in FIG. 3, the doping layer 310 is disposed in the threshold voltage adjustment layer 106 and the first enhancement layer 112, raising the band structure of the heterojunction between the buffer layer 104 and the threshold voltage adjustment layer 106. Therefore, the two-dimensional electron gas (2DEG) in the channel region 108 is reduced. In some embodiments, the high electron mobility transistor 300 is cut off when no gate voltage is applied. Therefore, the high electron mobility transistor 300 is an enhancement mode (E-mode) high electron mobility transistor.

In the embodiment as shown in FIG. 3, the threshold voltage adjustment layer 106 is mainly for increasing the threshold voltage, and the first enhancement layer 112 is mainly for reducing the on-resistance. Therefore, taking AlGaN as an example, the Al molar concentration of the threshold voltage adjustment layer 106 is less than that of the first enhancement layer 112, and the thickness of the threshold voltage adjustment layer 106 is less than that of the first enhancement layer 112. In some embodiments, the threshold voltage adjustment layer 106 has a thickness of between 1 nm and 5 nm and an Al molar concentration of between 0.05 M and 0.4 M. In some embodiments, the first enhancement layer 112 has a thickness of between 15 nm and 25 nm and an Al molar concentration of between 0.05 M and 0.4 M.

In the embodiments shown in FIG. 3, in addition to the threshold voltage adjustment layer 106 and the first enhancement layer 112, the doping layer 310 is disposed in the threshold voltage adjustment layer 106 and the first enhancement layer 112 beneath the gate electrode 114 to make the high electron mobility transistor 300 be an enhancement mode (E-mode) high electron mobility transistor. The piezoelectricity is modulated by the threshold voltage adjustment layer 106 and the first enhancement layer 112 to accurately control and increase the threshold voltage. When the enhancement mode (E-mode) high electron mobility transistor 300 is turned on, the two-dimensional electron gas (2DEG) is enhanced and the on-resistance is reduced.

As mentioned above, the present disclosure provides a high electron mobility transistor (HEMT) structure. The threshold voltage adjustment layer and the enhancement layer are formed above the buffer layer. The piezoelectricity can be modulated by fine-tuning the thickness and the III-V element molar concentration of the threshold voltage adjustment layer and the first enhancement layer. The threshold voltage is accurately controlled and increased while maintaining good uniformity. The two-dimensional electron gas (2DEG) is enhanced and the on-resistance is reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A high electron mobility transistor (HEMT), comprising:
    a buffer layer disposed on a substrate;
    a threshold voltage adjustment layer disposed on the buffer layer;
    a channel region disposed in the buffer layer adjacent to an interface between the buffer layer and the threshold voltage adjustment layer;
    a band adjustment layer disposed on the threshold voltage adjustment layer, wherein the band adjustment layer is a P-type doped III-V semiconductor;
    a first enhancement layer conformally covering the threshold voltage adjustment layer and the band adjustment layer;
    a gate electrode disposed on the first enhancement layer; and
    source/drain electrodes disposed on the buffer layer through the threshold voltage adjustment layer and the first enhancement layer on opposite sides of the gate electrode respectively;
    wherein the threshold voltage adjustment layer and the first enhancement layer are III-V semiconductors.

2. The high electron mobility transistor as claimed in claim 1, wherein the threshold voltage adjustment layer and the first enhancement layer each comprises $Al_xGa_{1-x}N$, wherein $0<x<1$.

3. The high electron mobility transistor as claimed in claim 2, wherein an Al molar concentration of the threshold voltage adjustment layer is less than an Al molar concentration of the first enhancement layer.

4. The high electron mobility transistor as claimed in claim 2, wherein the threshold voltage adjustment layer has an Al molar concentration of between 0.05 M and 0.4 M, and the first enhancement layer has an Al molar concentration of between 0.05 M and 0.4 M.

5. The high electron mobility transistor as claimed in claim 1, wherein a thickness of the threshold voltage adjustment layer is less than a thickness of the first enhancement layer.

6. The high electron mobility transistor as claimed in claim 1, wherein the threshold voltage adjustment layer has a thickness of between 1 nm and 5 nm, and the first enhancement layer has a thickness of between 15 nm and 25 nm.

7. The high electron mobility transistor as claimed in claim 1, further comprising:
    a second enhancement layer conformally covering the first enhancement layer.

8. The high electron mobility transistor as claimed in claim 7, wherein the second enhancement layer is an III-V semiconductor.

9. The high electron mobility transistor as claimed in claim 1, wherein the band adjustment layer comprises P-type doped GaN, AlGaN, AN, GaAs, AlGaAs, InP, InAlAs, or InGaAs.

10. The high electron mobility transistor as claimed in claim 1, wherein the band adjustment layer has a P-type dopant concentration of between $1e17/cm^3$ and $1e20/cm^3$.

11. A high electron mobility transistor (HEMT), comprising:
- a buffer layer disposed on a substrate;
- a threshold voltage adjustment layer disposed on the buffer layer;
- a channel region disposed in the buffer layer adjacent to an interface between the buffer layer and the threshold voltage adjustment layer;
- a first enhancement layer disposed on the threshold voltage adjustment layer;
- a gate electrode disposed on the first enhancement layer;
- source/drain electrodes disposed on the buffer layer through the threshold voltage adjustment layer and the first enhancement layer on opposite sides of the gate electrode respectively; and
- a doping region disposed in the threshold voltage adjustment layer and the first enhancement layer beneath the gate electrode;
- wherein the doping region comprises fluorine (F), and the threshold voltage adjustment layer and the first enhancement layer are semiconductors.

12. The high electron mobility transistor as claimed in claim 11, wherein the doping region has a dopant concentration of between $1e18/cm^3$ and $1e20/cm^3$.

13. The high electron mobility transistor as claimed in claim 11, wherein the threshold voltage adjustment layer and the first enhancement layer each comprises $Al_xGa_{1-x}N$, wherein $0<x<1$.

14. The high electron mobility transistor as claimed in claim 13, wherein an Al molar concentration of the threshold voltage adjustment layer is less than an Al molar concentration of the first enhancement layer.

15. The high electron mobility transistor as claimed in claim 13, wherein the threshold voltage adjustment layer has an Al molar concentration of between 0.05 M and 0.4 M, and the first enhancement layer has an Al molar concentration of between 0.05 M and 0.4 M.

16. The high electron mobility transistor as claimed in claim 11, wherein a thickness of the threshold voltage adjustment layer is less than a thickness of the first enhancement layer.

17. The high electron mobility transistor as claimed in claim 11, wherein the threshold voltage adjustment layer has a thickness of between 1 nm and 5 nm, and the first enhancement layer has a thickness of between 15 nm and 25 nm.

* * * * *